(12) United States Patent
Sugiyama et al.

(10) Patent No.: US 11,121,114 B2
(45) Date of Patent: Sep. 14, 2021

(54) WIRE BONDING TOOL INCLUDING A WEDGE TOOL

(71) Applicant: FUJI ELECTRIC CO., LTD., Kawasaki (JP)

(72) Inventors: Takanori Sugiyama, Matsumoto (JP); Yosuke Miyazawa, Okaya (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 224 days.

(21) Appl. No.: 16/048,962

(22) Filed: Jul. 30, 2018

(65) Prior Publication Data

US 2019/0088616 A1 Mar. 21, 2019

(30) Foreign Application Priority Data

Sep. 15, 2017 (JP) .............................. JP2017-178006

(51) Int. Cl.
*B23K 20/10* (2006.01)
*H01L 23/00* (2006.01)
(Continued)

(52) U.S. Cl.
CPC ............ *H01L 24/78* (2013.01); *B23K 20/004* (2013.01); *B23K 20/10* (2013.01); *H01L 24/85* (2013.01); *B23K 2101/40* (2018.08); *H01L 24/05* (2013.01); *H01L 24/45* (2013.01); *H01L 24/48* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/45014* (2013.01); *H01L 2224/45015* (2013.01); *H01L 2224/45139* (2013.01); *H01L 2224/45144* (2013.01); *H01L 2224/45147* (2013.01);
(Continued)

(58) Field of Classification Search
None
See application file for complete search history.

(56) References Cited

U.S. PATENT DOCUMENTS 3,690,538 A * 9/1972 Gaiser .................... H01L 24/85
228/1.1
3,934,783 A * 1/1976 Larrison ............... B23K 20/005
228/110.1

(Continued)

FOREIGN PATENT DOCUMENTS

| JP | S49-96279 A | 9/1974 |
| JP | S5236730 U | 3/1977 |

(Continued)

*Primary Examiner* — Devang R Patel
(74) *Attorney, Agent, or Firm* — Rabin & Berdo, P.C.

(57) ABSTRACT

A bonding tool includes a wedge tool that presses a bonding wire against a principal plane of a structure such as an electrode to which the bonding wire is to be bonded. A groove formed in an end portion of a wedge tool body of the wedge tool is inclined along a longitudinal direction of the bonding wire so that a heel side of the groove is closer to the principal plane of the structure than a toe side of the groove. As a result, the wedge tool is inclined at a tilt angle and the bonding wire fits the groove in the end portion of the wedge tool body along the longitudinal direction of the bonding wire. Thus, a corner portion of the wedge tool does not contact the electrode.

14 Claims, 12 Drawing Sheets

(51) Int. Cl.
 *B23K 20/00* (2006.01)
 *B23K 101/40* (2006.01)

(52) U.S. Cl.
 CPC ............... *H01L 2224/45164* (2013.01); *H01L 2224/45169* (2013.01); *H01L 2224/45565* (2013.01); *H01L 2224/45664* (2013.01); *H01L 2224/48472* (2013.01); *H01L 2224/48824* (2013.01); *H01L 2224/48839* (2013.01); *H01L 2224/48844* (2013.01); *H01L 2224/48847* (2013.01); *H01L 2224/78315* (2013.01); *H01L 2224/78611* (2013.01); *H01L 2224/78705* (2013.01); *H01L 2224/85186* (2013.01); *H01L 2224/85205* (2013.01); *H01L 2924/13055* (2013.01); *H01L 2924/13091* (2013.01)

(56) References Cited

U.S. PATENT DOCUMENTS

| | | | | |
|---|---|---|---|---|
| 3,971,499 A * | 7/1976 | Goodrich, Jr. | .......... | H01L 24/85 228/54 |
| 4,030,657 A | 6/1977 | Scheffer | | |
| 4,778,097 A * | 10/1988 | Hauser | ................. | B23K 20/106 228/1.1 |
| 5,018,658 A * | 5/1991 | Farassat | ............... | B23K 20/005 228/4.5 |
| 5,558,270 A * | 9/1996 | Nachon | ................ | B23K 20/005 228/180.5 |
| 7,451,905 B2 * | 11/2008 | Bell | ..................... | B23K 20/004 228/1.1 |
| 8,657,181 B2 * | 2/2014 | Cheng | .................... | H01L 24/85 228/4.5 |
| 8,820,609 B2 * | 9/2014 | Walker | ................ | B23K 20/004 228/4.5 |
| 9,543,267 B2 * | 1/2017 | Zaks | ...................... | H01L 24/78 |
| 9,929,122 B2 * | 3/2018 | Delsman | ............. | B23K 20/007 |
| 2006/0211176 A1 | 9/2006 | Shirasaka et al. | | |
| 2017/0256510 A1 | 9/2017 | Miyawaki et al. | | |

FOREIGN PATENT DOCUMENTS

| | | | | |
|---|---|---|---|---|
| JP | 2006-275594 A | | 10/2006 | |
| JP | 2013-135008 A | | 7/2013 | |
| JP | 2013135008 A | * | 7/2013 | ............ H01L 24/85 |
| JP | 2016051849 A | | 4/2016 | |
| JP | 2016191878 A | | 11/2016 | |

* cited by examiner

| DIAMETER OF WIRE [μm] | TILT ANGLE α [°] |
|---|---|
| 300 | 3.0±1 |
| 400 | 4.0±1 |
| 500 | 5.0±1 |
| 600 | 6.0±1 |

FIG. 7

WIRE BONDING TOOL INCLUDING A WEDGE TOOL

CROSS-REFERENCE TO RELATED APPLICATION

This application is based upon and claims the benefit of priority of the prior Japanese Patent Application No. 2017-178006, filed on Sep. 15, 2017, the entire contents of which are incorporated herein by reference.

BACKGROUND OF THE INVENTION

1. Field of the Invention

The embodiments discussed herein are related to a wedge tool and a wedge bonding method.

2. Background of the Related Art

Semiconductor devices including semiconductor elements, such as insulated gate bipolar transistors (IGBTs) or power metal oxide semiconductor field effect transistors (MOSFETs), are used as, for example, power converters. In such a semiconductor device, for example, electrodes of semiconductor elements or an electrode of a semiconductor element and a circuit board are electrically wired by performing wedge bonding of a wire made of aluminum and an aluminum alloy. See, for example, Japanese Laid-open Patent Publication No. 2013-135008.

By the way, a current flowing in a semiconductor device increases with an increase in current density. Accordingly, a large current flows through a portion (a bonding portion) in a semiconductor device to which a wire is bonded, and the bonding portion and a semiconductor element generate heat because of Joule heat. When a change in temperature occurs in this way in the semiconductor device, a thermal stress is created in the bonding portion because of the difference in thermal expansion coefficient between the wire and the semiconductor element or between the wire and a circuit board. As a result, part of the bonding portion near the bonding interface is destroyed because of thermal fatigue.

Therefore, copper (or a copper alloy) is adopted as a bonding wire in place of aluminum. Copper has low electric resistance, has a good heat conduction property, has a high melting point compared with aluminum, and has high rigidity. If copper is used as a bonding wire in a semiconductor device, destruction due to thermal fatigue caused by a thermal stress is reduced even in the case where a large current flows through a bonding portion. In addition, the use of not only a wire-shaped wiring member but also a ribbon-shaped wiring member is expected.

If a material, such as copper, having a low electric resistance or a high melting point is used as a wiring member, an end portion of a wedge tool may be brought into contact with a semiconductor element or a circuit board to which the wiring member is bonded. As a result, the semiconductor element or the circuit board is damaged and the quality of a semiconductor device deteriorates.

Furthermore, when a wedge tool ultrasonically vibrates in a state in which its end portion is in contact with a member to which a wiring member is bonded, the wedge tool may have abnormal amplitude. This causes damage to the wedge tool or breaking of the wiring member.

The present inventors found, by diligent examination, that when a wiring member is pressed against a member to which the wiring member is bonded, a wedge tool tilts and that for this reason its end portion comes in contact at the time of ultrasonic vibration with a semiconductor element or a circuit board to which the wiring member is bonded. The details are as follows.

Wedge bonding in which a copper wire is used as a wiring member will now be described with reference to FIGS. 12A through 12C.

FIGS. 12A through 12C are views for describing wedge bonding performed on a semiconductor element using of a conventional bonding tool.

FIGS. 12A through 12C illustrate on a time series basis wedge bonding performed on a semiconductor element using a bonding tool.

A bonding tool 100 includes a wedge tool 101, a wire guide 102 which holds a bonding wire 1, and a cutter (not illustrated) which cuts the bonding wire 1 after bonding.

The wedge tool 101 presses the bonding wire 1 against a semiconductor element 141 while ultrasonically vibrating. By doing so, the wedge tool 101 bonds the bonding wire 1 to the semiconductor element 141.

The wire guide 102 guides the bonding wire 1 supplied onto a portion of the semiconductor element 141, to which it is bonded, and holds it.

The cutter cuts the bonding wire 1 bonded to the semiconductor element 141 by the wedge tool 101.

With the bonding tool 100 having the above structure, first the bonding wire 1 supplied to the semiconductor element 141 is held by the wire guide 102 (FIG. 12A).

The wedge tool 101 is then moved to the semiconductor element 141 side. By doing so, the wedge tool 101 begins to press the bonding wire 1 against the semiconductor element 141 with its end portion (FIG. 12B). Thus, an edge A (FIG. 12B) of the end portion of the wedge tool 101 is brought into contact with the bonding wire 1.

The wedge tool 101 is moved further to the semiconductor element 141 side. By doing so, the bonding wire 1 is pressed by the semiconductor element 141. However, the rigidity of copper is higher than that of aluminum. Accordingly, bending of the bonding wire 1 at the edge A of the end portion of the wedge tool 101 does not progress. As a result, as indicated by a dashed arrow in FIG. 12B, the end portion of the wedge tool 101 slides along the bonding wire 1 in a direction reverse to the wire guide 102. Accordingly, the wedge tool 101 tilts (FIG. 12C).

As illustrated in FIG. 12C, the wedge tool 101 tilts. As a result, the bonding wire 1 is pressed only by the edge A of the end portion of the wedge tool 101. Therefore, uniform bonding is not performed and the end portion of the wedge tool 101 contacts the semiconductor element 141 at the time of ultrasonic vibration.

SUMMARY OF THE INVENTION

According to an aspect, there is provided a wedge tool that presses a wiring member against a bonding surface of a structure to which the wiring member is bonded by a wedge bonding method. The wedge tool includes a wedge tool body having a heel side, a toe side, and an end portion; and a groove that is provided in the end portion of the wedge tool body, that is configured to extend along a longitudinal direction of said wiring member, and that is inclined so that the groove on the heel side of the wedge tool body is closer to said bonding surface than the groove on the toe side of the wedge tool body.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 7 illustrates tilt angles of bottom portions of the wedge tool according to the first embodiment in relation to diameters of a wire;

DETAILED DESCRIPTION OF THE INVENTION

Embodiments will now be described with reference to the accompanying drawings.

First Embodiment

First a method for wedge bonding performed in the fabrication of a semiconductor device using a bonding tool will be described with reference to FIG. 1.

Figure 1:
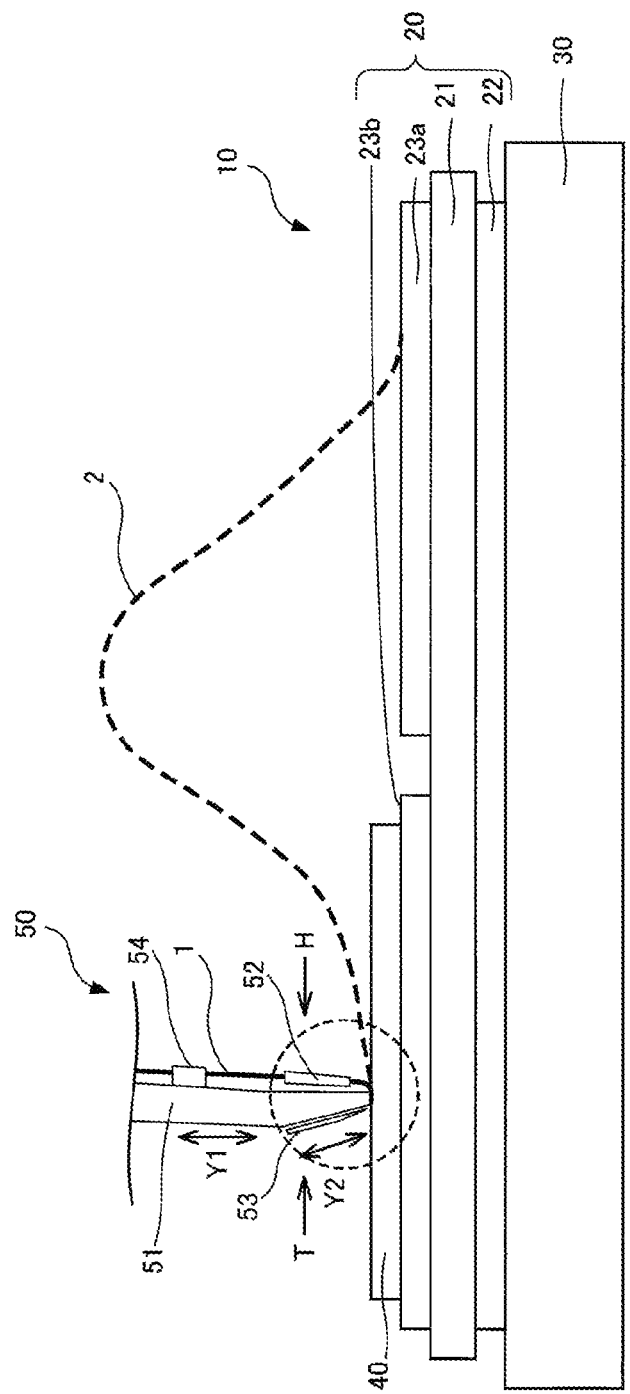
FIG. 1 is a view for describing wedge bonding performed in the fabrication of a semiconductor device.

FIG. 1 is a view for describing wedge bonding performed in the fabrication of a semiconductor device. FIG. 1 illustrates a wedge bonding step in the process for fabricating a semiconductor device.

As illustrated in FIG. 1, a structure 10 of a semiconductor device includes a ceramic circuit board 20, a radiation section 30, and a semiconductor element 40.

The ceramic circuit board 20 includes an insulating board 21, a metal plate 22 formed over a back surface of the insulating board 21, and circuit boards 23a and 23b formed over a front surface of the insulating board 21.

The insulating board 21 is made of a ceramic, such as aluminum oxide, aluminum nitride, or silicon nitride, having a high heat conduction property.

The metal plate 22 is made of metal, such as aluminum, iron, silver, copper, or an alloy containing at least one of them, having a good heat conduction property.

The circuit boards 23a and 23b are made of a material having good electrical conductivity. For example, aluminum, copper, or an alloy containing at least one of them is used as such a material. For improving resistance to corrosion, a material, such as nickel, may be formed by plating treatment or the like over a surface of the radiation section 30 integrated into a cooler. To be concrete, an alloy of nickel and phosphorus, an alloy of nickel and boron, or the like may be used in place of nickel. The circuit boards 23a and 23b are taken as an example. The number of circuit boards is not limited to two. Three or more circuit boards may be disposed.

For example, a direct copper bonding (DCB) board or an active metal brazed (AMB) board may be used as the ceramic circuit board 20 having the above structure. The ceramic circuit board 20 conducts heat generated by the semiconductor element 40 to the radiation section 30 via the circuit board 23b, the insulating board 21, and the metal plate 22.

The insulating board 21 has, for example, a rectangular shape in planar view. Furthermore, the metal plate 22 has a rectangular shape in planar view and its area is smaller than that of the insulating board 21. Therefore, the ceramic circuit board 20 has, for example, a rectangular shape.

As illustrated in FIG. 1, the radiation section 30 has, for example, the shape of a plate and is made of metal, such as aluminum, iron, silver, copper, or an alloy containing at least one of them, having a good heat conduction property. Furthermore, for improving resistance to corrosion, a plating layer may be formed by plating treatment or the like over a surface of the radiation section 30 using of a material such as nickel. To be concrete, an alloy of nickel and phosphorus, an alloy of nickel and boron, or the like may be used in place of nickel.

A heat radiation property may be improved by bonding a cooler (not illustrated) to a back surface of the radiation section 30 with solder, silver solder, or the like therebetween or mechanically fitting a cooler (not illustrated) on a back surface of the radiation section 30 with a thermal paste or the like therebetween. In this case, the cooler is made of metal, such as aluminum, iron, silver, copper, or an alloy containing at least one of them, having a good heat conduction property. In addition, a fin, a heat sink having a plurality of fins, a water-cooling cooler, or the like may be used as the cooler. Moreover, the radiation section 30 may be integrated into this cooler. In that case, the radiation section 30 and the cooler are made of metal, such as aluminum, iron, silver, copper, or an alloy containing at least one of them, having a good heat conduction property. For improving resistance to corrosion, a material, such as nickel, may be formed by plating treatment or the like over a surface of the radiation section 30 integrated into the cooler. To be concrete, an alloy of nickel and phosphorus, an alloy of nickel and boron, or the like may be used in place of nickel.

The semiconductor element 40 includes a switching element, such as an IGBT or a power MOSFET, made of silicon or silicon carbide. For example, the semiconductor element 40 has a drain electrode (or a collector electrode) as a main electrode on the back surface and has a gate electrode and a source electrode (or an emitter electrode) as main electrodes on the front surface.

Furthermore, the semiconductor element 40 includes a diode, such as a Schottky barrier diode (SBD) or a freewheeling diode (FWD), at need. This semiconductor element 40 has a cathode electrode as a main electrode on the back surface and has an anode electrode as a main electrode on the front surface. The back surface of the above semiconductor element 40 is bonded to a determined circuit pattern (not illustrated) of the circuit board 23b.

The electrodes of the semiconductor element 40 are made of metal, such as copper, aluminum, gold, silver, or an alloy containing at least one of them, having good electrical conductivity. In addition, for improving resistance to corrosion, a material, such as nickel, may be formed over a surface of the semiconductor element 40. Moreover, it is desirable that a material whose hardness is greater than or equal to that of a bonding wire 1 be used for forming the electrodes on the surface of the semiconductor element 40 on which wedge bonding is performed.

The semiconductor element 40 is bonded to the circuit board 23b with solder (not illustrated) therebetween. A plurality of semiconductor elements 40 may properly be disposed over the circuit boards 23a and 23b of the ceramic circuit board 20 at need.

A bonding tool 50 of a bonding apparatus which performs wedge bonding on the above structure 10 of the semiconductor device will now be described.

The bonding tool 50 includes a wedge tool 51, a wire guide 52, a cutter 53, and a clamping mechanism 54.

An ultrasonic transducer (not illustrated) which generates ultrasonic waves is connected to the wedge tool 51. A groove described later is formed in an end portion of the wedge tool 51. For example, the ultrasonic transducer generates ultrasonic waves having a frequency in a range of 60 kHz to 150 kHz. The wedge tool 51 moves upward or downward (in FIG. 1) along a direction indicated by arrow Y1. As described later, when the bonding wire 1 is supplied, the wedge tool 51 moves downward (in FIG. 1), holds the bonding wire 1 with the groove, and presses the bonding wire 1 against a portion, such as an electrode, of the semiconductor element 40 to which the bonding wire 1 is to be bonded. The wedge tool 51 presses the bonding wire 1 and ultrasonically vibrates by receiving ultrasonic waves from the ultrasonic transducer. By doing so, the wedge tool 51 bonds the bonding wire 1 to the portion of the semiconductor element 40 to which the bonding wire 1 is to be bonded. After the bonding wire 1 is bonded in this way to the portion of the semiconductor element 40 to which the bonding wire 1 is to be bonded, the supply of ultrasonic waves from the ultrasonic transducer is stopped and the wedge tool 51 moves upward (in FIG. 1) and returns to the original position.

The bonding wire 1 is made of a material whose electric resistance is low and whose melting point is at least higher than that of aluminum. For example, copper, palladium, platinum, gold, silver, or an alloy containing at least one of them is used as such a material. Furthermore, it is desirable from the viewpoint of workability and material cost to use copper, palladium, platinum, an alloy containing at least one of them, or the like. In addition, the rigidity of aluminum is about $7 \times 10^{10}$ Pa in Young's modulus. On the other hand, the rigidity of copper is about $13 \times 10^{10}$ Pa, the rigidity of palladium is about $11 \times 10^{10}$ Pa, the rigidity of platinum is about $17 \times 10^{10}$ Pa, the rigidity of gold is about $8 \times 10^{10}$ Pa, and the rigidity of silver is about $8 \times 10^{10}$ Pa. Therefore, the rigidity of the bonding wire 1 is at least higher than that of aluminum. Moreover, it is desirable that the rigidity of the bonding wire 1 be higher than or equal to $10 \times 10^{10}$ Pa. High rigidity reduces breaking of a wire caused by thermal stress. Furthermore, a surface of the bonding wire 1 may be coated with palladium or the like.

The diameter of the bonding wire 1 is in a range of 300 μm to 600 μm. It is more desirable that the diameter of the bonding wire 1 be in a range of 400 μm to 500 μm. The shape of a cross section of the bonding wire 1 is not limited to a circle. A cross section of the bonding wire 1 may have an oval or rectangular shape. In the first embodiment and a second embodiment, descriptions are given with a case where the bonding wire 1 is used as a wiring member as an example. However, a wiring member is not limited to the bonding wire 1. A ribbon whose cross section has a flat shape may be used as a wiring member.

The wire guide 52 houses the bonding wire 1 therein. The wire guide 52 guides the supply of the bonding wire 1 to the portion of the semiconductor element 40 to which the bonding wire 1 is to be bonded and holds the guided bonding wire 1.

The cutter 53 moves upward or downward (in FIG. 1) along an arrow Y2 independently of the wedge tool 51. After the bonding wire 1 is bonded, the cutter 53 cuts off the excess of the bonding wire 1.

The clamping mechanism 54 is disposed on a side of the wedge tool 51. The clamping mechanism 54 holds the bonding wire 1 guided by the wire guide 52 or releases the bonding wire 1 thus making the wire guide 52 guide the bonding wire 1. By doing so, the clamping mechanism 54 controls the supply of the bonding wire 1 from the wire guide 52.

The bonding apparatus includes the above bonding tool 50. Wedge bonding described below is performed by the bonding tool 50 controlled by a controller, such as a central processing unit (CPU), in the bonding apparatus.

Wedge bonding performed by the above bonding tool 50 on the structure 10 of the semiconductor device will now be described.

First the structure 10 is set at a determined position of the bonding apparatus.

The bonding tool 50 is moved to be placed over an electrode (not illustrated) of the semiconductor element 40 over the ceramic circuit board 20.

The bonding wire 1 released from the clamping mechanism 54 is guided by the wire guide 52 and is supplied over the electrode of the semiconductor element 40. The supply of the bonding wire 1 from the clamping mechanism 54 is then stopped.

Figure 4:
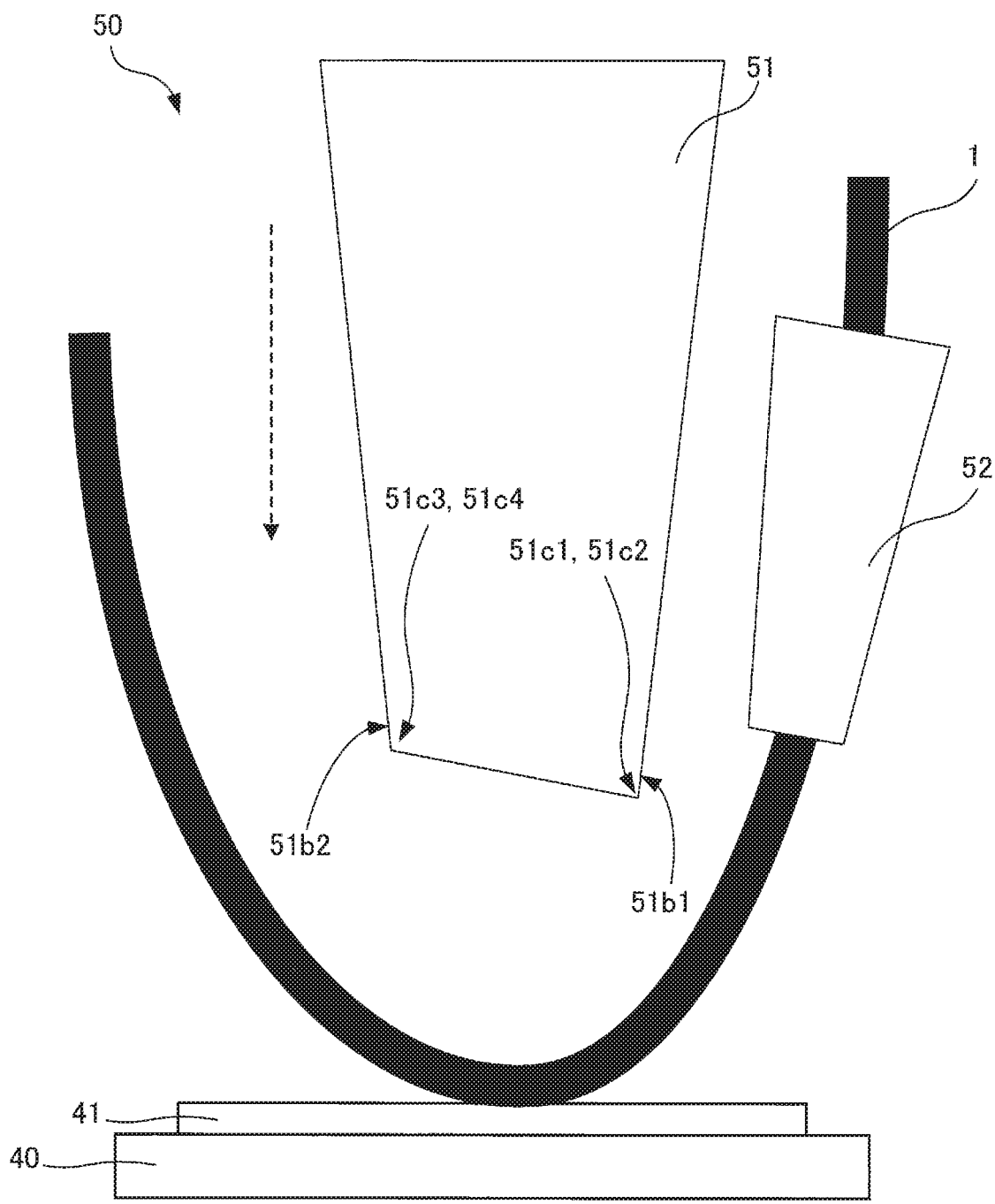
FIG. 4 is a view for describing a method for wedge bonding performed on a semiconductor element using a bonding tool according to the first embodiment (part 1)
Figure 5:
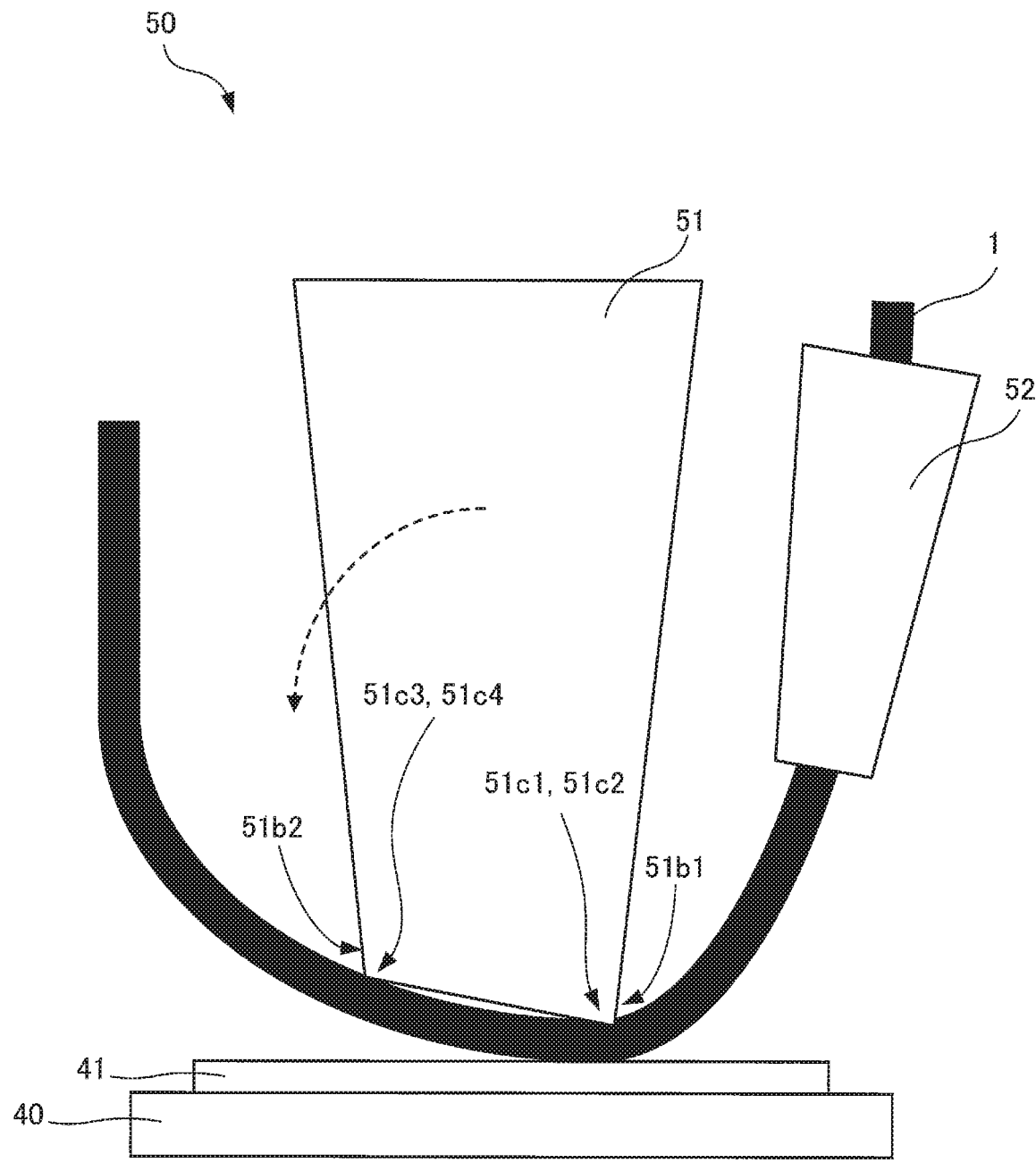
FIG. 5 is a view for describing a method for wedge bonding performed on a semiconductor element using a bonding tool according to the first embodiment (part 2)
Figure 6:
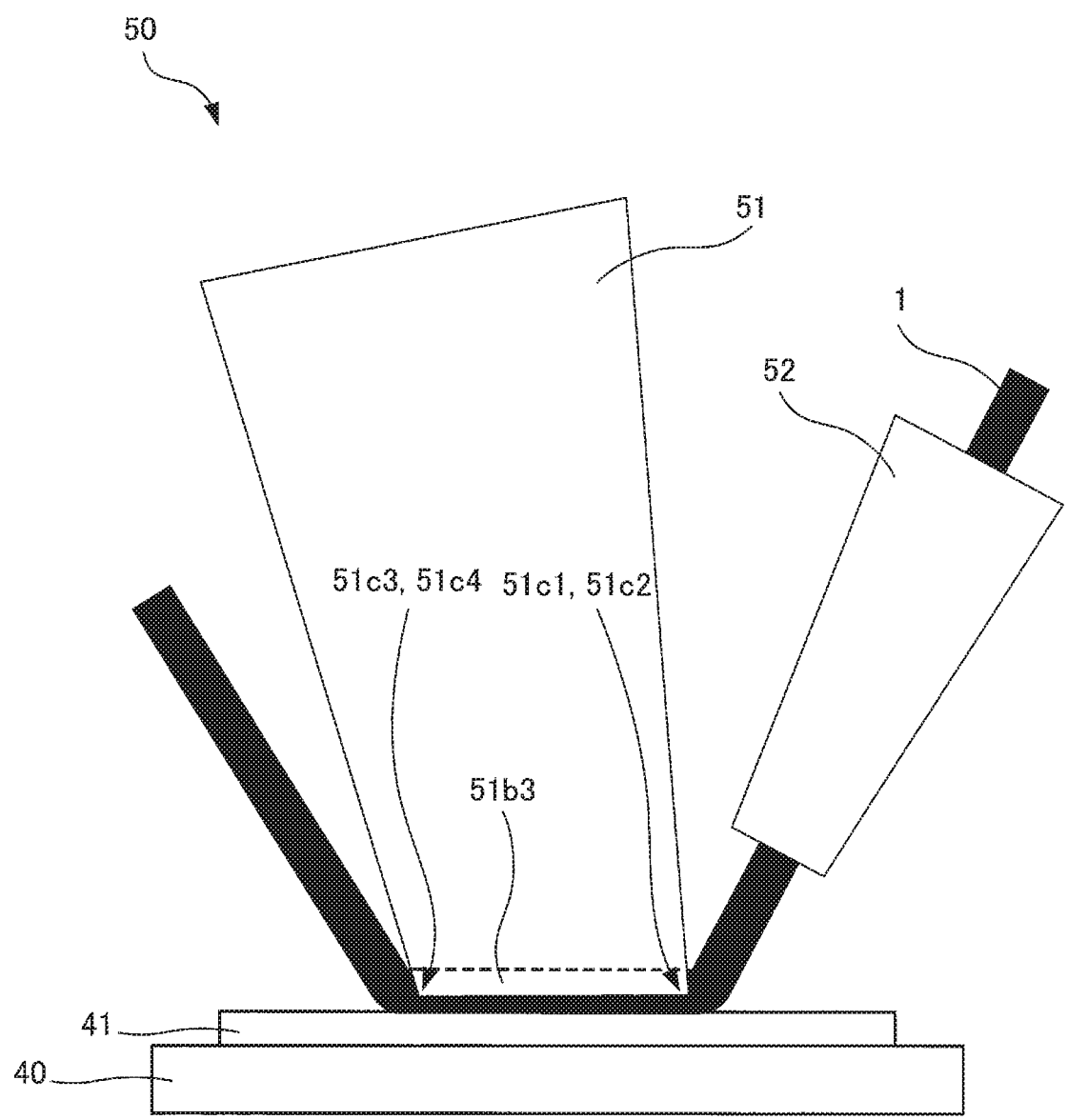
FIG. 6 is a view for describing a method for wedge bonding performed on a semiconductor element using a bonding tool according to the first embodiment (part 3)

The wedge tool 51 is moved down perpendicularly to the surface of the electrode of the semiconductor element 40. Then, the bonding wire 1 is pressed against the electrode with an end portion of the wedge tool 51, during which the wedge tool 51 is being vibrated. By doing so, the bonding wire 1 is bonded to the electrode. The details of pressing performed at this time will be described later (FIGS. 4 through 6).

After that, the bonding tool 50 (end portion of the wedge tool 51) is moved to be placed over the circuit board 23a along a trajectory 2 indicated by a dashed line in FIG. 1.

The bonding wire 1 is bonded over the circuit board 23a in the same way that is described above. After that, the end portion of the wedge tool 51 is shifted from a bonding portion and the cutter 53 is moved to cut off the excess of the bonding wire 1.

The details of the end portion of the wedge tool 51 included in the bonding tool 50 will now be described with reference to FIGS. 2 and 3.

Figure 2:
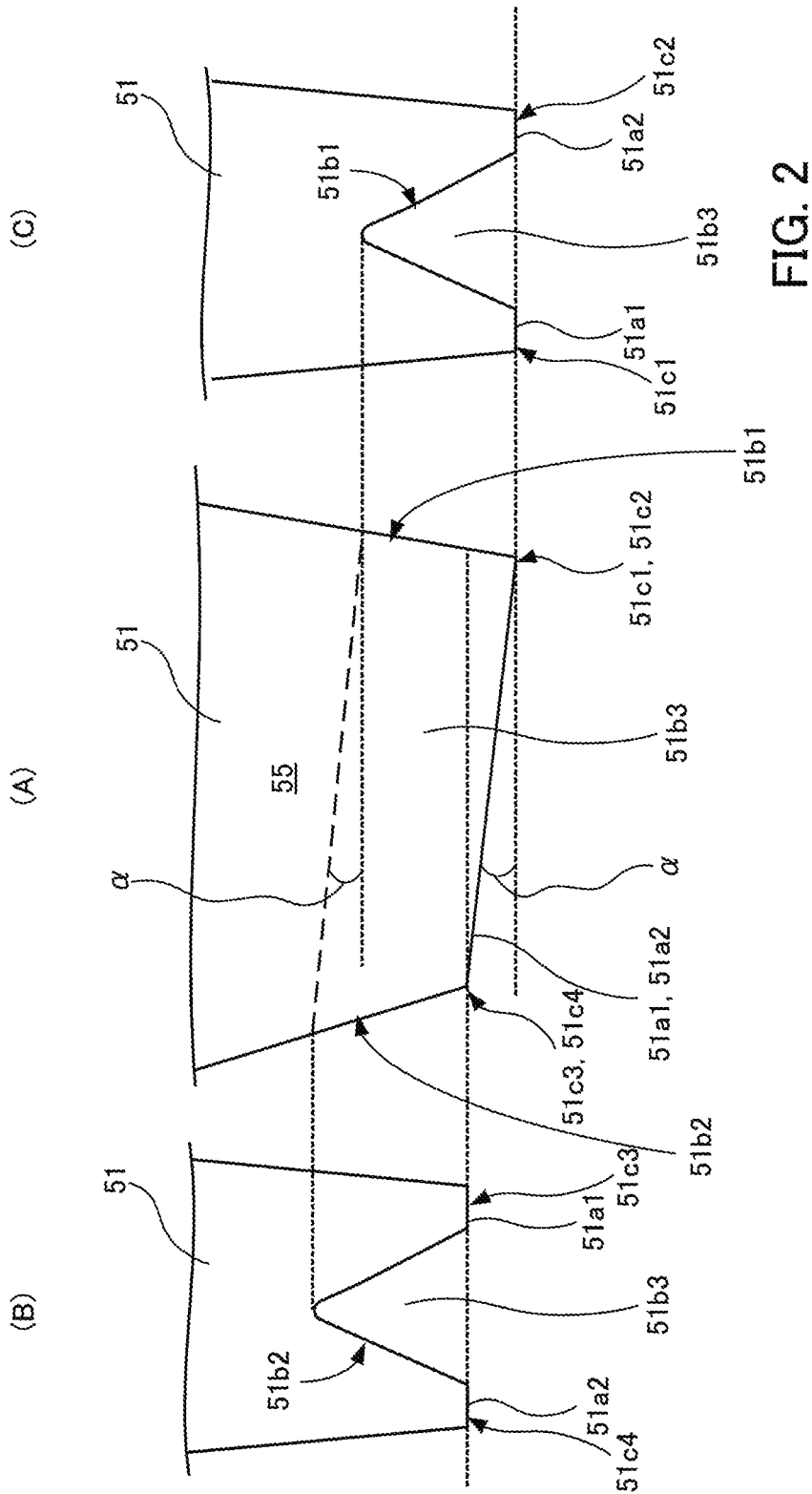
FIG. 2 is a view for describing an end portion of a wedge tool according to a first embodiment (part 1)
Figure 3:
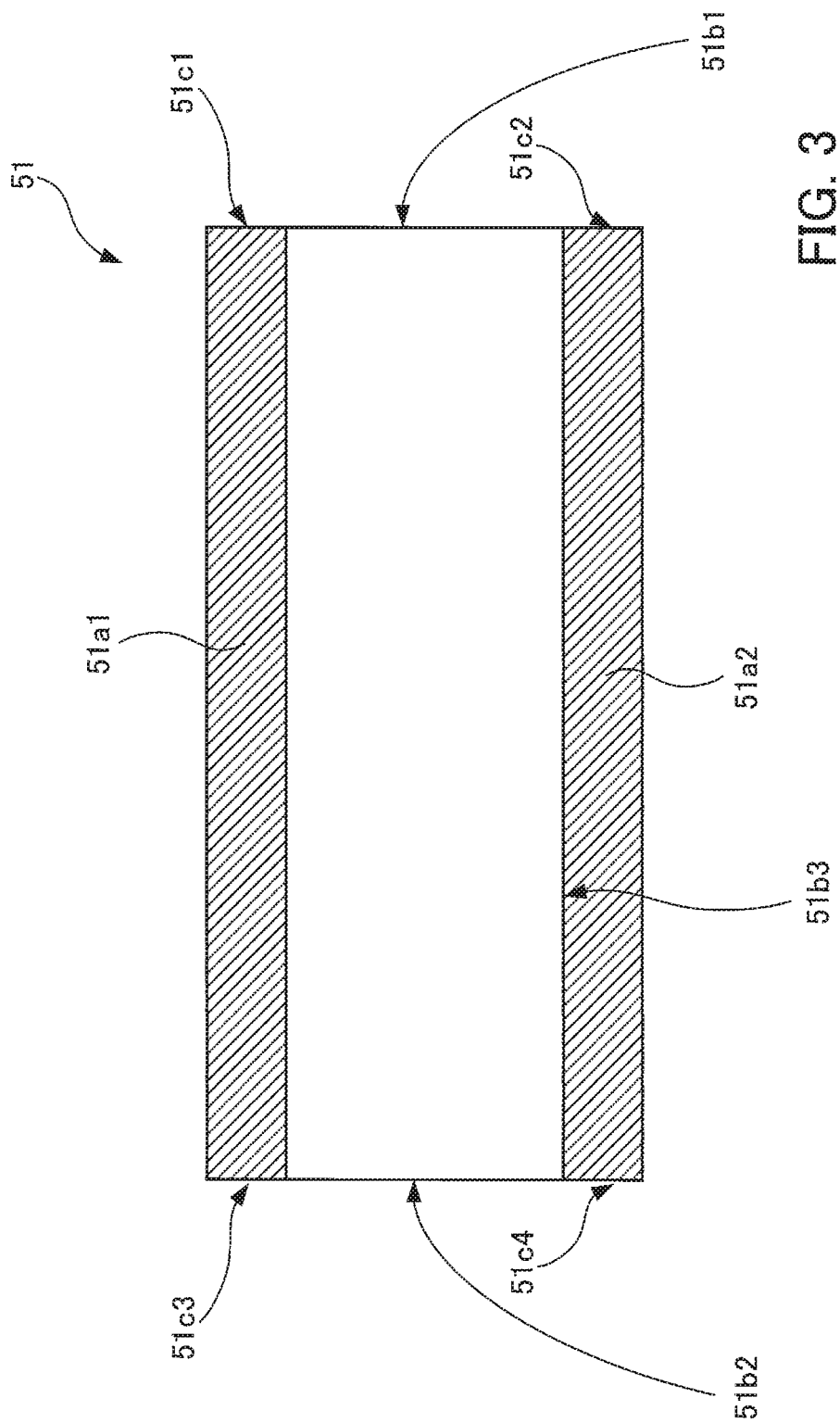
FIG. 3 is a view for describing an end portion of a wedge tool according to a first embodiment (part 2)

FIGS. 2 and 3 are views for describing the end portion of the wedge tool 51 according to the first embodiment.

(A) of FIG. 2 illustrates the front of the end portion of the wedge tool 51 having wedge tool body 55, (B) of FIG. 2 illustrates an end surface (toe side, T) of the end portion of the wedge tool 51, and (C) of FIG. 2 illustrates an end surface (heel side, H) of the end portion of the wedge tool 51. Furthermore, FIG. 3 illustrates the bottom of the end portion of the wedge tool 51. The toe side, T, is a side on which the end of the bonding wire 1 is situated in the end portion of the wedge tool 51. For example, the toe side, T, is on the left side in FIG. 1. The heel side, H, is a side on which the bonding wire 1 is supplied in the end portion of the wedge tool 51. For example, the heel side, H, is reverse to the toe side, T, and is on the left Wight side in FIG. 1.

A groove 51b3 extending between the heel side (heel opening portion 51b1) and the toe side (toe opening portion 51b2) is formed in the central portion of the bottom of the end portion of the wedge tool 51 along the longitudinal direction of the bonding wire 1 (FIG. 3). In addition, bottom portions 51a1 and 51a2 are formed on both sides of the groove 51b3 along the groove 51b3 in the bottom of the end portion of the wedge tool 51. Furthermore, the bottom portion 51a1 includes a corner portion 51c1 on the heel side and a corner portion 51c3 on the toe side and the bottom portion 51a2 includes a corner portion 51c2 on the heel side and a corner portion 51c4 on the toe side (FIG. 3).

Moreover, as illustrated in (B) and (C) of FIG. 2, each of the toe opening portion 51b2 on the toe side and the heel opening portion 51b1 on the heel side, which are the ends of the groove 51b3, has an inverted V shape.

Each of the bottom portions 51a1 and 51a2 of the wedge tool 51 has a determined tilt angle α from the heel side to the toe side. As indicated by a dashed line in (A) of FIG. 2, the groove 51b3 is also inclined at the tilt angle α. The relationship between the tilt angle α and the diameter of the bonding wire 1 will be described later.

A method for performing wedge bonding using the bonding tool 50 including the above wedge tool 51 will now be described with reference to FIGS. 4 through 6.

FIGS. 4 through 6 are views for describing a method for wedge bonding performed on the semiconductor element using the bonding tool according to the first embodiment. FIGS. 4 through 6 are enlarged views of the front of the end portion of the wedge tool 51. Furthermore, the cutter 53 is not illustrated. In addition, only the semiconductor element 40, of the structure 10, having an electrode 41 on the principal plane is illustrated.

As stated above, first the structure 10 is set at the determined position of the bonding apparatus. The bonding tool 50 is moved to be placed over the electrode 41 of the semiconductor element 40 over the ceramic circuit board 20 (not illustrated). The bonding wire 1 released from the clamping mechanism 54 (not illustrated) is guided by the wire guide 52 and is supplied over the electrode 41 of the semiconductor element 40. The supply of the bonding wire 1 from the clamping mechanism 54 (not illustrated) is then stopped (FIG. 4).

Next, as indicated by a dashed arrow in FIG. 4, the bonding tool 50 is moved down toward the electrode 41 perpendicularly to the surface of the electrode 41. By doing so, the bonding wire 1 is pressed against the electrode 41 with the corner portions 51c1 and 51c2 of the end portion of the wedge tool 51. As illustrated in FIG. 5, at this time the corner portions 51c1 and 51c2 of the wedge tool 51 press the bonding wire 1. The bonding wire 1 bends with the corner portions 51c1 and 51c2 of the wedge tool 51 as fulcrums. As a result, the bonding wire 1 is fixed onto the electrode 41 by the wedge tool 51.

When the bonding tool 50 is moved down further, the wedge tool 51 is inclined to the left toward the toe side along a dashed arrow in FIG. 5 with the corner portions 51c1 and 51c2 of the end portion as fulcrums.

As a result, as illustrated in FIG. 6, the wedge tool 51 is inclined at the tilt angle α. The bonding wire 1 fits the groove 51b3 in the end portion of the wedge tool 51 along the longitudinal direction of the bonding wire 1. The result is that the corner portion 51c3 or 51c4 of the wedge tool 51 does not contact electrode 41. Thus, the wedge tool 51 goes into a state in which it presses the bonding wire 1 against the electrode 41. In this state, the wedge tool 51 does not cause damage to the electrode 41. In addition, because abnormal amplitude is suppressed, the wedge tool 51 does not cut the bonding wire 1.

With the bonding tool 50, the wedge tool 51 in the state illustrated in FIG. 6 presses the bonding wire 1 against the electrode 41 and ultrasonically vibrates by receiving ultrasonic waves from the ultrasonic transducer. By doing so, the wedge tool 51 bonds the bonding wire 1 to the electrode 41.

After that, the bonding tool 50 is moved to the next bonding portion and the same bonding that is described above is performed. In addition, the bonding wire 1 may be cut using the cutter 53 (not illustrated) as needed.

The relationship between the tilt angle α of the end portion of the bonding tool 50 and the diameter of the bonding wire 1 will now be described with reference to FIG. 7.

FIG. 7 illustrates tilt angles of the bottom portions of the wedge tool according to the first embodiment in relation to diameters of the wire.

It is assumed that the bonding wire 1 is made of copper or a copper alloy and that a bonding surface of the electrode 41 or the like of the semiconductor element 40 to which the bonding wire 1 is bonded is made of copper or a copper alloy.

Usually the above bonding wire 1 having a diameter in a range of 300 μm to 600 μm is used. In FIG. 7, the optimum tilt angle α is indicated for each of the diameters of 300, 400, 500, and 600 μm.

For example, if the bonding wire 1 having a diameter of 300 μm and made of copper or a copper alloy is closely pressed against the member to which the bonding wire 1 is bonded, then the optimum tilt angle α of the end portion of the wedge tool 51 is 3.0°. Actually, however, there is a tolerance of about ±1.0° depending on machining accuracy. Therefore, the tilt angle of the end portion of the wedge tool 51 is in the range of 2.0 to 4.0°.

If the bonding wire 1 having a diameter of 400, 500, or 600 μm and made of copper or a copper alloy is pressed against the member to which the bonding wire 1 is bonded, it is desirable that the tilt angle of the end portion of the wedge tool 51 be about 4.0±1.0°, 5.0±1.0°, or 6.0±1.0°. As has been described, if the bonding wire 1 has a diameter in a range of 300 μm to 600 μm, then the end portion of the wedge tool 51 having a tilt angle in a range of 2.0° to 7.0° is formed.

As stated above, the bonding tool 50 included in the above bonding apparatus has the wedge tool 51 which presses the bonding wire 1 against the principal plane of the electrode 41 to which the bonding wire 1 is bonded. The groove 51b3 formed in the end portion of the wedge tool 51 is inclined along the longitudinal direction of the bonding wire 1 so that the heel side will be closer to the principal plane of the electrode 41 than the toe side.

The above wedge tool 51 is moved down toward the principal plane of the electrode 41. The corner portions 51c1 and 51c2 of the wedge tool 51 press the bonding wire 1. The wedge tool 51 is inclined with the corner portions 51c1 and 51c2 as fulcrums. As a result, the wedge tool 51 is inclined at the tilt angle α. Thus, the corner portions 51c3 and 51c4 of the wedge tool 51 do not make contact with the electrode 41. The bonding wire 1 fits the groove 51b3 in the end portion of the wedge tool 51 along the longitudinal direction of the bonding wire 1. Thus, the wedge tool 51 goes into a state in which it presses the bonding wire 1 against the electrode 41. In this state, the wedge tool 51 does not cause damage to the electrode 41. In addition, because abnormal amplitude is suppressed, the wedge tool 51 does not cut the bonding wire 1. Furthermore, at this time damage to the end portion of the wedge tool 51 is reduced.

Accordingly, wedge bonding of the bonding wire 1 is stably performed. Damage to a member, such as the electrode 41, to which the bonding wire 1 is bonded is prevented and deterioration in the reliability of the semiconductor device including the structure 10 is suppressed.

Second Embodiment

In a second embodiment description will be given with a case where the end portion of the wedge tool according to the first embodiment has another shape as an example.

A bonding apparatus according to the second embodiment includes a bonding tool 50a. The bonding tool 50a includes a wire guide 52, a cutter 53, and a clamping mechanism 54. This is the same with the first embodiment. In addition, the bonding tool 50a includes a wedge tool 61 having wedge tool body 65 described in FIGS. 8 and 9.

Figure 8:
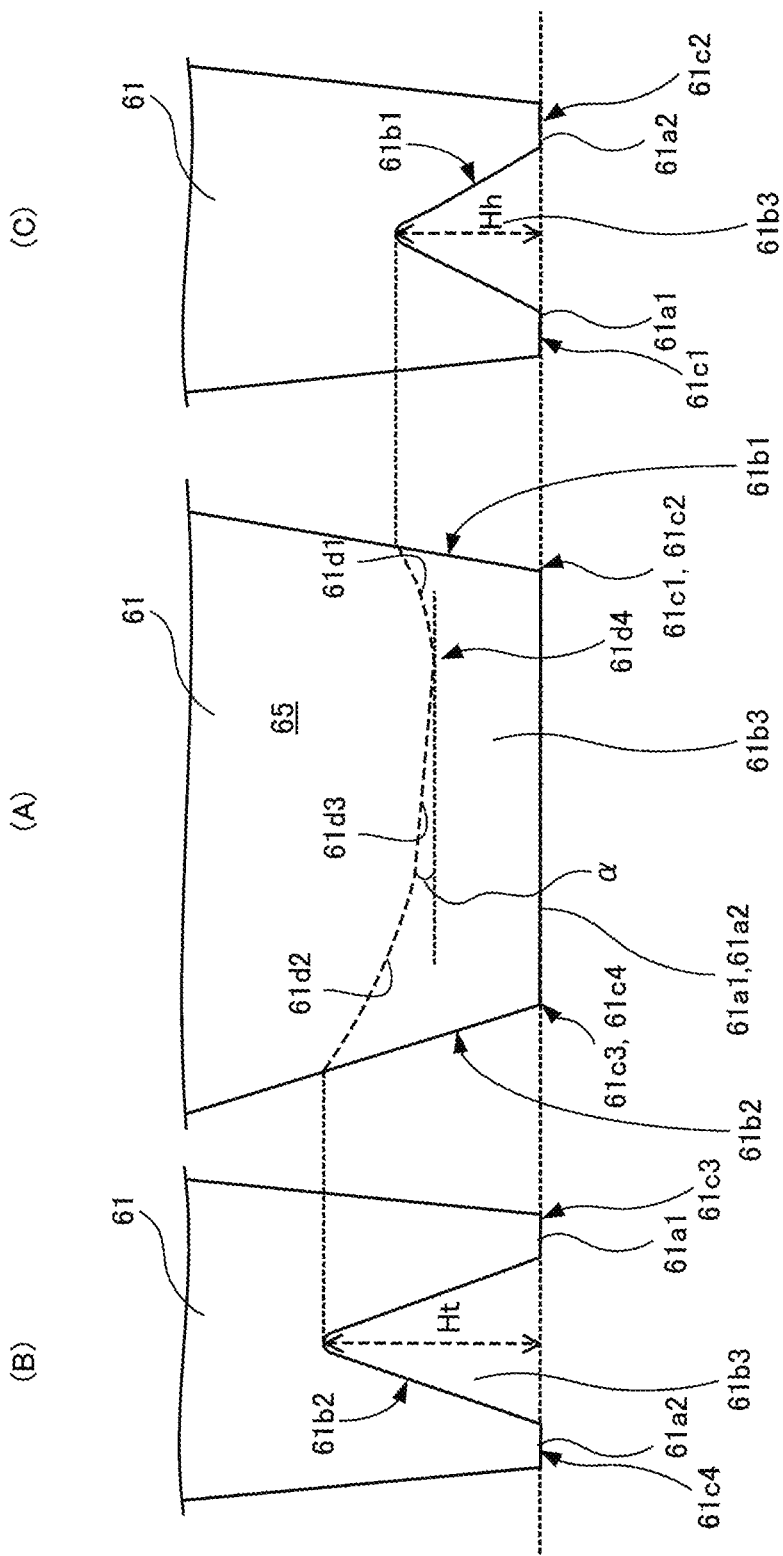
FIG. 8 is a view for describing an end portion of a wedge tool according to a second embodiment (part 1)
Figure 9:
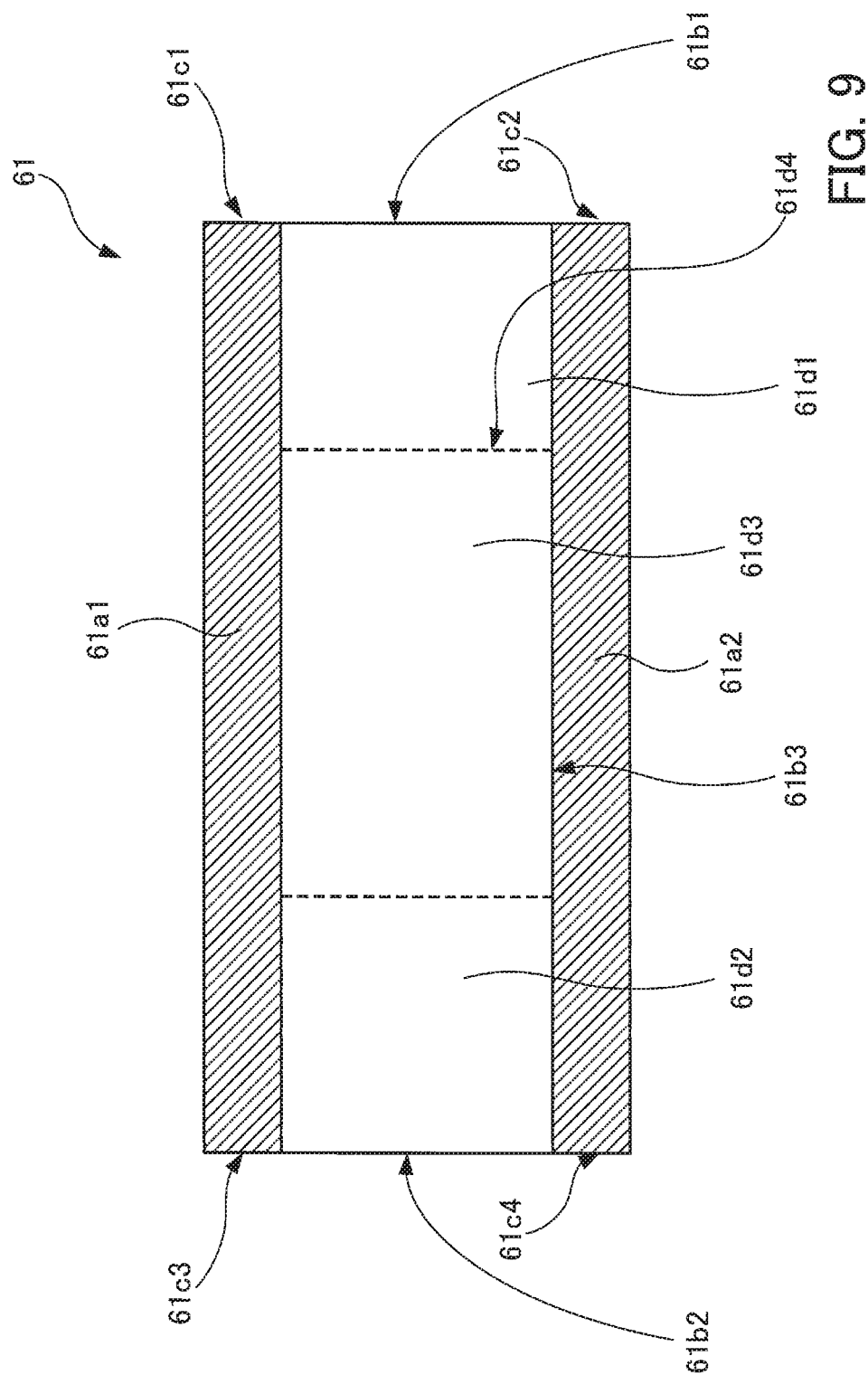
FIG. 9 is a view for describing an end portion of a wedge tool according to a second embodiment (part 2)

FIGS. 8 and 9 are views for describing an end portion of the wedge tool 61 according to the second embodiment. (A) of FIG. 8 illustrates the front of the end portion of the wedge tool 61, (B) of FIG. 8 illustrates an end surface (toe side) of the end portion of the wedge tool 61, and (C) of FIG. 8 illustrates an end surface (heel side) of the end portion of the wedge tool 61. Furthermore, FIG. 9 illustrates the bottom of the end portion of the wedge tool 61.

A groove 61b3 extending between the heel side (heel opening portion 61b1) and the toe side (toe opening portion 61b2) is formed in a central portion of the bottom of the end portion of the wedge tool 61 along the longitudinal direction of a bonding wire 1 (FIG. 9). In addition, bottom portions 61a1 and 61a2 are formed on both sides of the groove 61b3 along the groove 61b3 in the bottom of the end portion of the wedge tool 61. Furthermore, the bottom portion 61a1 includes a corner portion 61c1 on the heel side and a corner portion 61c3 on the toe side and the bottom portion 61a2 includes a corner portion 61c2 on the heel side and a corner portion 61c4 on the toe side (FIG. 9).

Unlike the wedge tool 51 according to the first embodiment, each of the bottom portions 61a1 and 61a2 of the wedge tool 61 does not have a tilt angle and is formed in parallel with the principal plane of a member to which the bonding wire 1 is bonded.

As illustrated in (A) of FIG. 8, the groove 61b3 has a curved surface 61d1 which widens on the heel opening portion 61b1 side. In addition, the groove 61b3 has a curved surface 61d2 which widens on the toe opening portion 61b2 side. The curvature of the curved surface 61d2 is larger than that of the curved surface 61d1.

Furthermore, as illustrated in (B) and (C) of FIG. 8, each of the toe opening portion 61b2 on the toe side and the heel opening portion 61b1 on the heel side, which are the ends of the groove 61b3, has an inverted V shape. Moreover, because the curvature of the curved surface 61d2 is larger than that of the curved surface 61d1, an opening height Hh of the heel opening portion 61b1 is lower than an opening height Ht of the toe opening portion 61b2.

A curved surface 61d3 is formed that connects the curved surface 61d1 and the curved surface 61d2. The curved surface 61d3 has a determined tilt angle α from the heel side to the toe side. In addition, a corner portion 61d4 is formed in a position where the curved surface 61d1 and the curved surface 61d3 are connected.

In the first embodiment, a case where each of the bottom portions 51a1 and 51a2 has the same tilt angle α as the groove 51b3 has is described. In the second embodiment, as stated above, a case where each of the bottom portions 61a1 and 61a2 is formed in parallel with a bonding surface of a member to which the bonding wire 1 is bonded is taken as an example. However, other cases are possible. For example, the tilt angle α of the bottom portions 61a1 and 61a2 may be greater than or equal to zero (case where the bottom portions 61a1 and 61a2 are formed in parallel with a bonding surface of a member to which the bonding wire 1 is bonded) and less than or equal to the tilt angle α of the groove 61b3.

A method for performing bonding using of the bonding tool 50a including the above wedge tool 61 will now be described with reference to FIGS. 10 and 11.

Figure 10:
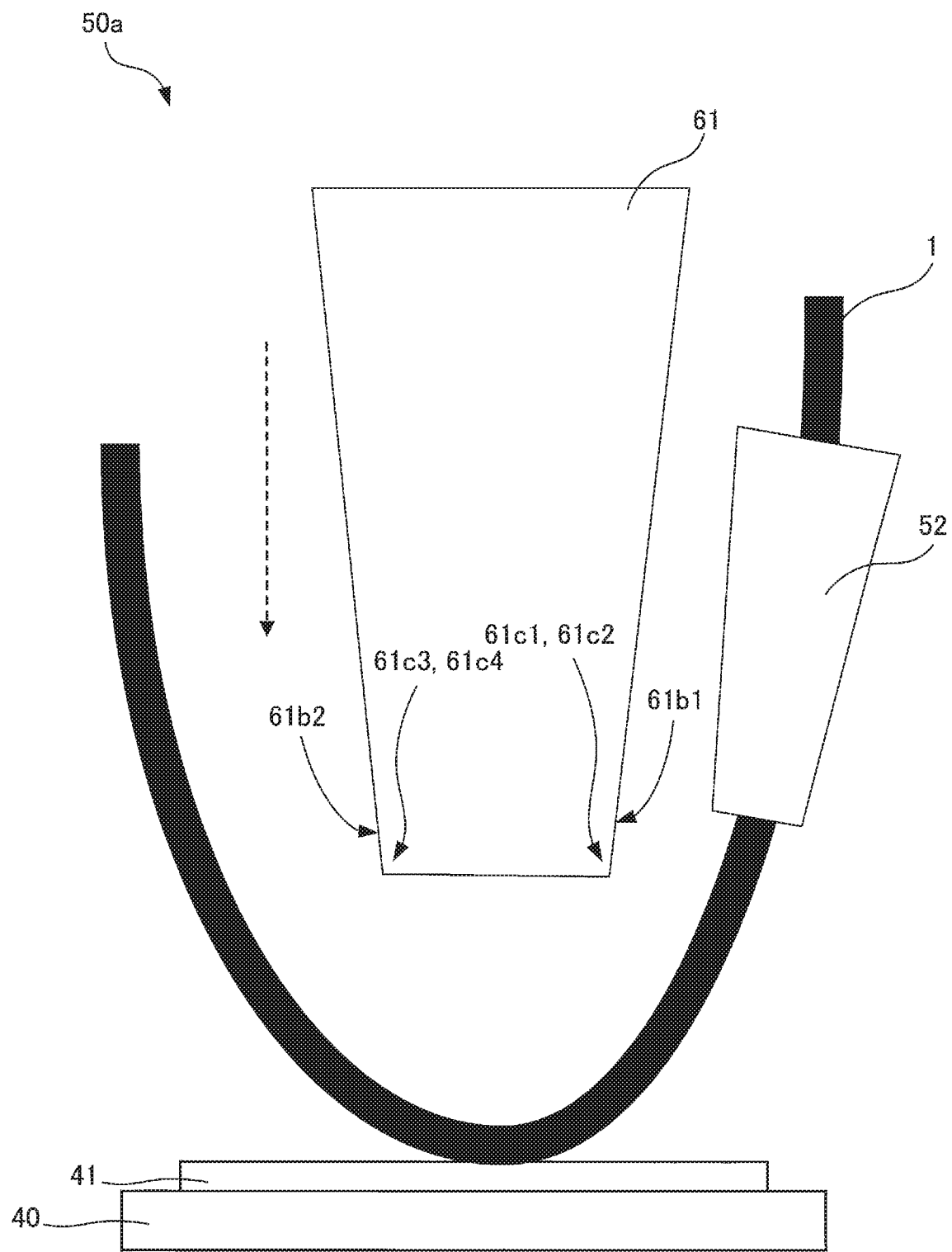
FIG. 10 is a view for describing wedge bonding performed on a semiconductor element using a bonding tool according to the second embodiment (part 1)
Figure 11:
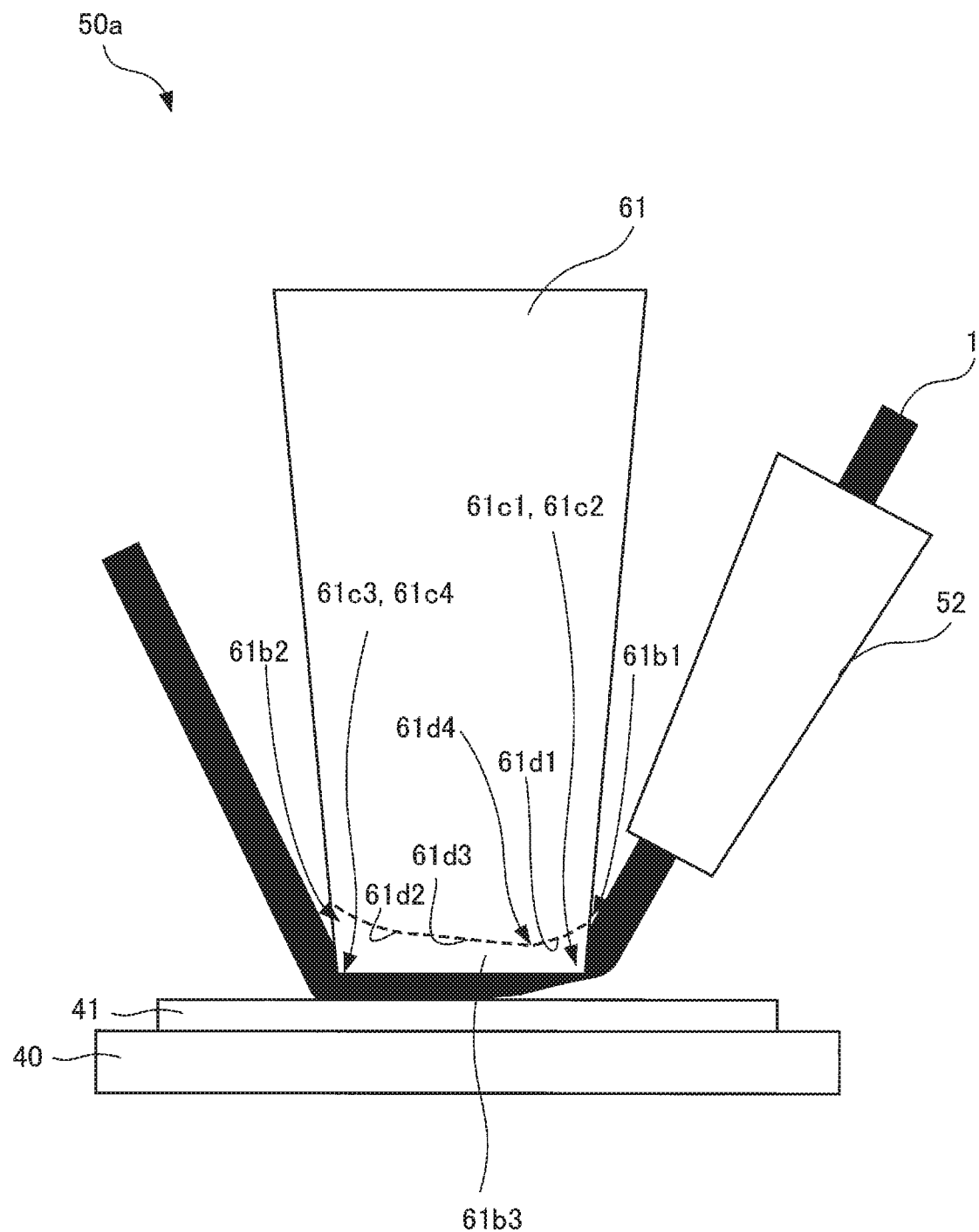
FIG. 11 is a view for describing wedge bonding performed on a semiconductor element using a bonding tool according to the second embodiment (part 2)
Figure 12A:
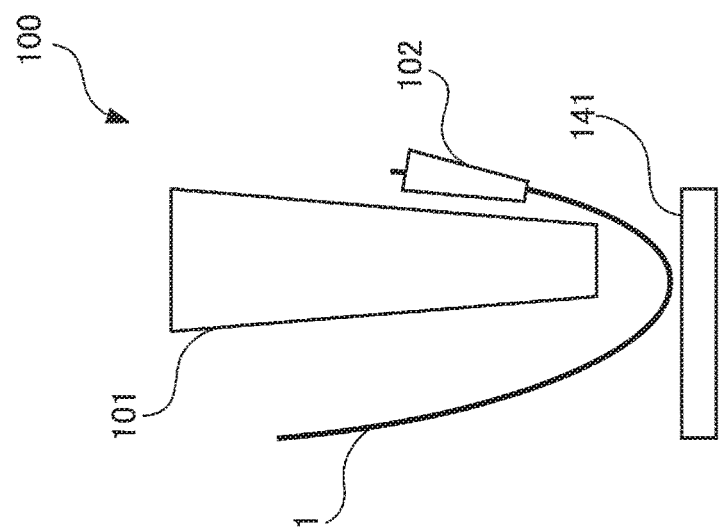
FIGS. 12A to 12C are views for describing wedge bonding performed on a semiconductor element using a conventional bonding tool.
Figure 12B:
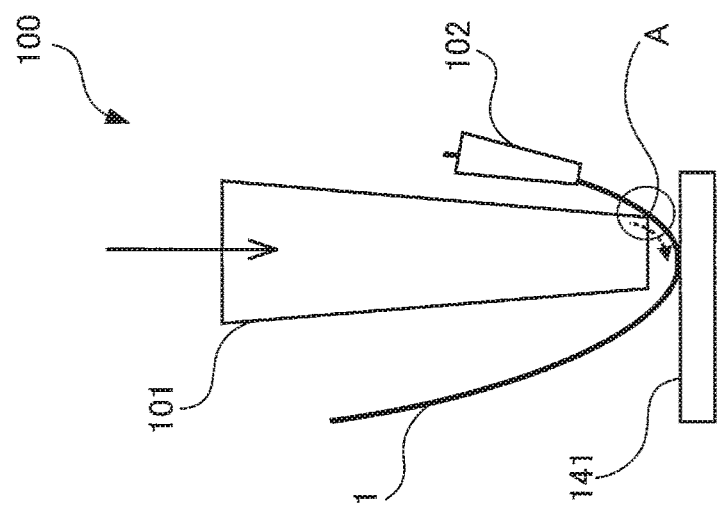
Figure 12C:
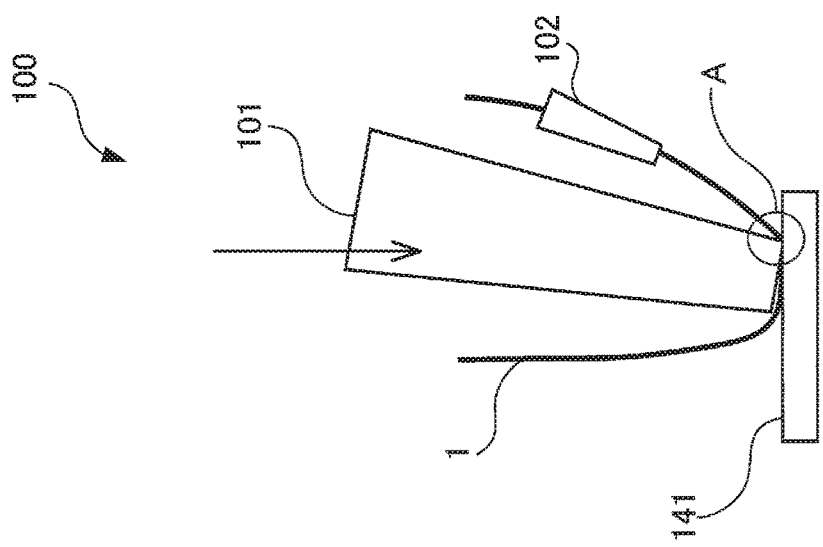

FIGS. 10 and 11 are views for describing wedge bonding performed on a semiconductor element using the bonding tool according to the second embodiment. FIGS. 10 and 11 are enlarged views of the front of the end portion of the wedge tool 61. Furthermore, the cutter 53 is not illustrated. In addition, only a semiconductor element 40, of a structure 10, having an electrode 41 on the principal plane is illustrated.

As stated above, first the structure 10 is set at a determined position of the bonding apparatus. The bonding tool 50a is moved to be placed over the electrode 41 of a semiconductor element 40 over a ceramic circuit board 20 (not illustrated). The bonding wire 1 released from the clamping mechanism 54 (not illustrated) is guided by the wire guide 52 and is supplied over the electrode 41 of the semiconductor element 40. The supply of the bonding wire 1 from the clamping mechanism 54 (not illustrated) is then stopped (FIG. 10).

Next, as indicated by a dashed arrow in FIG. 10, the bonding tool 50a is moved down toward the electrode 41 perpendicularly to the principal plane of the electrode 41. As illustrated in FIG. 11, the bonding wire 1 fits the groove 61b3 in the end portion of the wedge tool 61 along the longitudinal direction of the bonding wire 1 and the bonding wire 1 is pressed against the electrode 41. As illustrated in FIG. 11, at this time the corner portion 61d4 in the groove 61b3 of the wedge tool 61 presses the bonding wire 1. The bonding wire 1 bends with the corner portion 61d4 in the groove 61b3 of the wedge tool 61 as a fulcrum. As a result, the bonding wire 1 is fixed onto the electrode 41 by the wedge tool 61.

At this time the bonding wire 1 fits the groove 61b3 in the end portion of the wedge tool 61 along the curved surfaces 61d1, 61d2, and 61d3.

As a result, as illustrated in FIG. 11, the bonding wire 1 fits the groove 61b3 in the end portion of the wedge tool 61 along the longitudinal direction of the bonding wire 1. This means that the corner portion 61c1, 61c2, 61c3, or 61c4 of the wedge tool 61 does not contact electrode 41. Thus, the wedge tool 61 goes into a state in which it presses the bonding wire 1 against the electrode 41. In this state, the wedge tool 61 does not cause damage to the electrode 41. In addition, because abnormal amplitude is suppressed, the wedge tool 61 does not cut the bonding wire 1.

With the bonding tool 50a, the wedge tool 61 in the state illustrated in FIG. 11 presses the bonding wire 1 against the electrode 41 and ultrasonically vibrates by receiving ultrasonic waves from an ultrasonic transducer. By doing so, the wedge tool 61 bonds the bonding wire 1 to the electrode 41.

After that, the bonding tool 50*a* is moved to the next bonding portion and the same bonding that is described above is performed. In addition, the bonding wire 1 may be cut using of the cutter 53 (not illustrated) as needed.

The same conditions that are described in FIG. 7 in the first embodiment are applied to a tilt angle α of the curved surface 61*d*3 of the groove 61*b*3 of the wedge tool 61 according to the second embodiment. For example, if the bonding wire 1 having a diameter of 300, 400, 500, or 600 μm and made of copper or a copper alloy is pressed against a member to which the bonding wire 1 is bonded, it is desirable that the tilt angle of the curved surface 61*d*3 of the groove 61*b*3 of the wedge tool 61 be about 3.0±1.0°, 4.0±1.0°, 5.0±1.0°, or 6.0±1.0°. In short, if the bonding wire 1 has a diameter in a range of 300 μm to 600 μm, then the curved surface 61*d*3 of the groove 61*b*3 of the wedge tool 61 having a tilt angle in a range of 2.0° to 7.0° is formed.

As stated above, the bonding tool 50*a* included in the above bonding apparatus has the wedge tool 61 which presses the bonding wire 1 against the principal plane of the electrode 41 to which the bonding wire 1 is bonded. The groove 61*b*3 formed in the end portion of the wedge tool 61 has the curved surface 61*d*3 that is inclined along the longitudinal direction of the bonding wire 1 so that the heel side of the curved surface 61*d*3 will be closer to the principal plane of the electrode 41 than the toe side of the curved surface 61*d*3.

The above wedge tool 61 is moved down toward the principal plane of the electrode 41. The corner portion 61*d*4 of the wedge tool 61 presses the bonding wire 1. As a result, the bonding wire 1 fits the groove 61*b*3 in the end portion of the wedge tool 61 along the longitudinal direction of the bonding wire 1. This means that the corner portion 61*c*1, 61*c*2, 61*c*3, or 61*c*4 of the wedge tool 61 does not contact electrode 41. Thus, the wedge tool 61 goes into a state in which it presses the bonding wire 1 against the electrode 41. In this state, the wedge tool 61 does not cause damage to the electrode 41. In addition, because abnormal amplitude is suppressed, the wedge tool 61 does not cut the bonding wire 1. Furthermore, at this time damage to the end portion of the wedge tool 61 is reduced.

Accordingly, wedge bonding of the bonding wire 1 is stably performed. Damage to a member, such as the electrode 41, to which the bonding wire 1 is bonded is prevented and deterioration in the reliability of a semiconductor device including the structure 10 is suppressed.

According to the disclosed technique, wedge bonding of a bonding wire is stably performed on a member to which the bonding wire is bonded. Damage to the member to which the bonding wire is bonded is prevented and deterioration in the reliability of a semiconductor device is suppressed.

All examples and conditional language provided herein are intended for the pedagogical purposes of aiding the reader in understanding the invention and the concepts contributed by the inventor to further the art and are not to be construed as limitations to such specifically recited examples and conditions, nor does the organization of such examples in the specification relate to a showing of the superiority and inferiority of the invention. Although one or more embodiments of the present invention have been described in detail, it is understood that various changes, substitutions, and alterations could be made hereto without departing from the spirit and scope of the invention.

What is claimed is:

1. A wedge tool configured to press a wiring member against a bonding surface of a structure to which the wiring member is being bonded by a wedge bonding method, the wedge tool comprising:
   a wedge tool body having a side cross section which extends vertically and has a tapering wedge shape, a heel side, a toe side, and an end portion;
   a wire guide disposed on the wedge tool body along the heel side thereof; and
   a groove that is defined in the end portion of the wedge tool body, that entirely extends in a longitudinal direction from the heel side to the toe side, that has a groove height from said bonding surface, that is configured to accommodate at least a portion of said wiring member, and that is inclined downwardly from the toe side to the heel side with respect to a horizontal surface so that the groove height on the heel side of the wedge tool body is less than the groove height on the toe side and the groove on the heel side of the wedge tool body is closer to said bonding surface than the groove on the toe side of the wedge tool body.

2. The wedge tool according to claim 1, wherein the groove further comprises a pair of bottom portions disposed along the longitudinal direction on both sides of the groove on a side of the end portion facing the bonding surface, the pair of bottom portions being planar.

3. The wedge tool according to claim 2, wherein the pair of bottom portions are inclined in a same manner as that of the groove.

4. The wedge tool according to claim 3, wherein the groove on the heel side of the wedge tool has a heel opening portion having an opening height, wherein the groove on the toe side of the wedge tool has a toe opening portion having an opening height, and wherein the opening height of the toe opening portion is equal to the opening height of the heel opening portion.

5. The wedge tool according to claim 2, wherein the pair of bottom portions are parallel to the bonding surface.

6. The wedge tool according to claim 5, wherein the groove on the heel side of the wedge tool has a heel opening portion having an opening height, wherein the groove on the toe side of the wedge tool has a toe opening portion having an opening height, and wherein the opening height of the toe opening portion is greater than the opening height of the heel opening portion.

7. The wedge tool according to claim 1, wherein the groove has a tilt angle ranging from 2.0° to 7.0°.

8. The wedge tool according to claim 1, wherein the wiring member is made of copper, palladium, platinum, gold, silver, or an alloy containing at least one of copper, palladium, platinum, gold, and silver.

9. The wedge tool according to claim 1, wherein the wiring member has a Young's modulus rigidity of $10 \times 10^{10}$ Pa or more.

10. The wedge tool according to claim 1, wherein the wiring member is wire-shaped.

11. The wedge tool according to claim 10, wherein the wiring member has a diameter ranging from 300 μm to 600 μm.

12. The wedge tool according to claim 11, wherein the wiring member has a diameter ranging from 400 μm to 500 μm.

13. The wedge tool according to claim 1, wherein the wiring member is ribbon-shaped.

14. The wedge tool according to claim 1, wherein the groove includes corner portions on the heel side, and wherein the corner portion does not contact said bonding surface of said structure.

* * * * *